United States Patent
Lowes et al.

(10) Patent No.: US 9,450,163 B1
(45) Date of Patent: Sep. 20, 2016

(54) SURFACE MOUNT DEVICE WITH STRESS MITIGATION MEASURES

(71) Applicant: Cree, Inc., Durham, NC (US)

(72) Inventors: Theodore D. Lowes, Lompoc, CA (US); Peter Scott Andrews, Durham, NC (US); Jesse Reiherzer, Raleigh, NC (US); Amber Christine Salter, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/721,525

(22) Filed: May 26, 2015

(51) Int. Cl.
| | |
|---|---|
| *H01L 33/00* | (2010.01) |
| *H01L 33/64* | (2010.01) |
| *H01L 33/48* | (2010.01) |
| *H01L 33/62* | (2010.01) |
| *H05K 1/02* | (2006.01) |

(52) U.S. Cl.
CPC .......... *H01L 33/642* (2013.01); *H01L 33/486* (2013.01); *H01L 33/62* (2013.01); *H05K 1/0271* (2013.01)

(58) Field of Classification Search
CPC ... H01L 33/612; H01L 33/486; H01L 33/62; H01L 2924/00014; H01L 23/5389; H05K 1/0271

See application file for complete search history.

(56) References Cited

U.S. PATENT DOCUMENTS

| | | | | |
|---|---|---|---|---|
| 8,610,140 B2 * | 12/2013 | Joo | ........................ | H01L 33/60 257/88 |
| 2005/0168960 A1 * | 8/2005 | Asahi | .................... | H01L 21/568 361/761 |
| 2007/0057364 A1 * | 3/2007 | Wang | ....................... | C03C 8/02 257/701 |
| 2007/0063336 A1 * | 3/2007 | Hase | ................... | B81C 1/00333 257/698 |
| 2009/0321760 A1 * | 12/2009 | Kuhmann | ......... | H01L 21/76898 257/98 |
| 2013/0003375 A1 * | 1/2013 | Hussell | ................. | H01L 33/486 362/249.02 |
| 2013/0258658 A1 * | 10/2013 | Hussell | ............... | H01L 25/0753 362/235 |
| 2013/0341656 A1 * | 12/2013 | Chan | ..................... | H01L 33/486 257/88 |

* cited by examiner

*Primary Examiner* — Yosef Gebreyesus
(74) *Attorney, Agent, or Firm* — Anthony J. Josephson

(57) ABSTRACT

An SMD includes a substrate and one or more electrical contacts on a first surface of the substrate. Each one of the electrical contacts are configured to couple to a corresponding electrical contact located on a surface of a carrier, and are located within a concentric area of the first surface that is less than about 50% of a total area of the first surface. By providing the electrical contacts within the concentric area, the mechanical stress experienced by the electrical contacts can be significantly reduced when compared to conventional SMDs including electrical contacts on the outer edges thereof. Accordingly, the failure rate of the SMD due to separation of one or more of the electrical contacts from the carrier may be reduced.

25 Claims, 19 Drawing Sheets

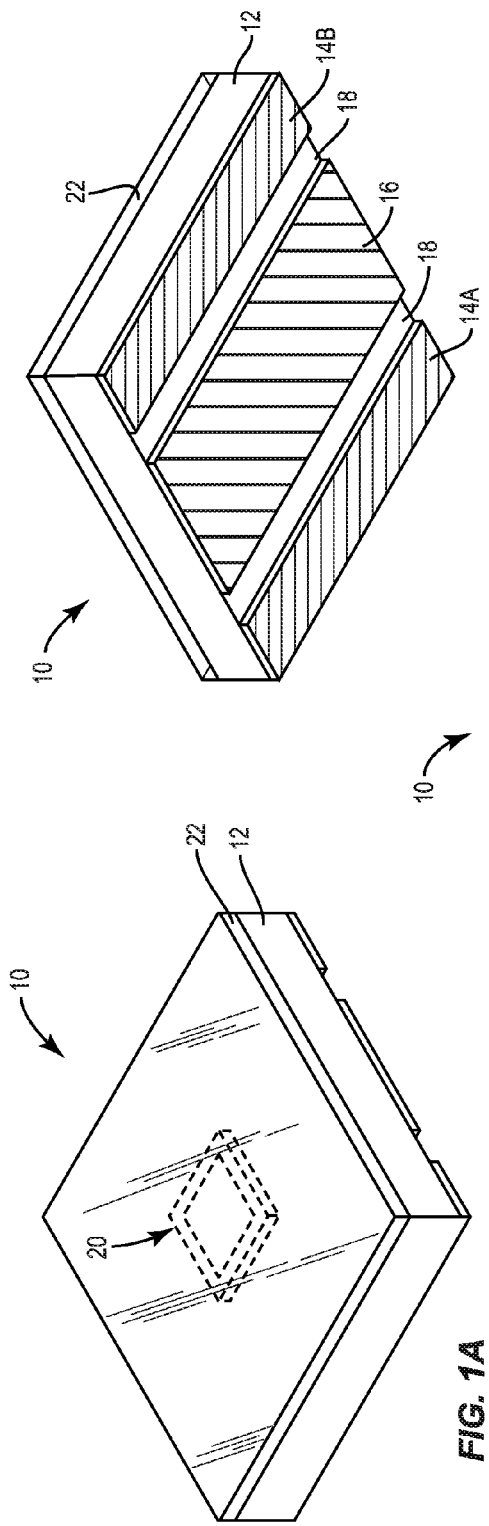
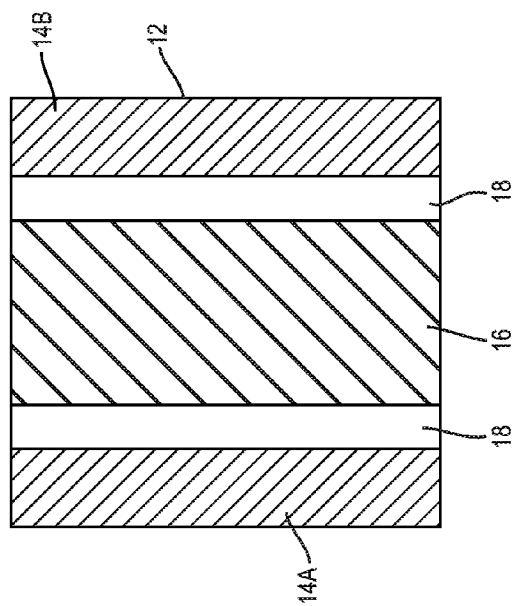
FIG. 1A
FIG. 1B
FIG. 1C

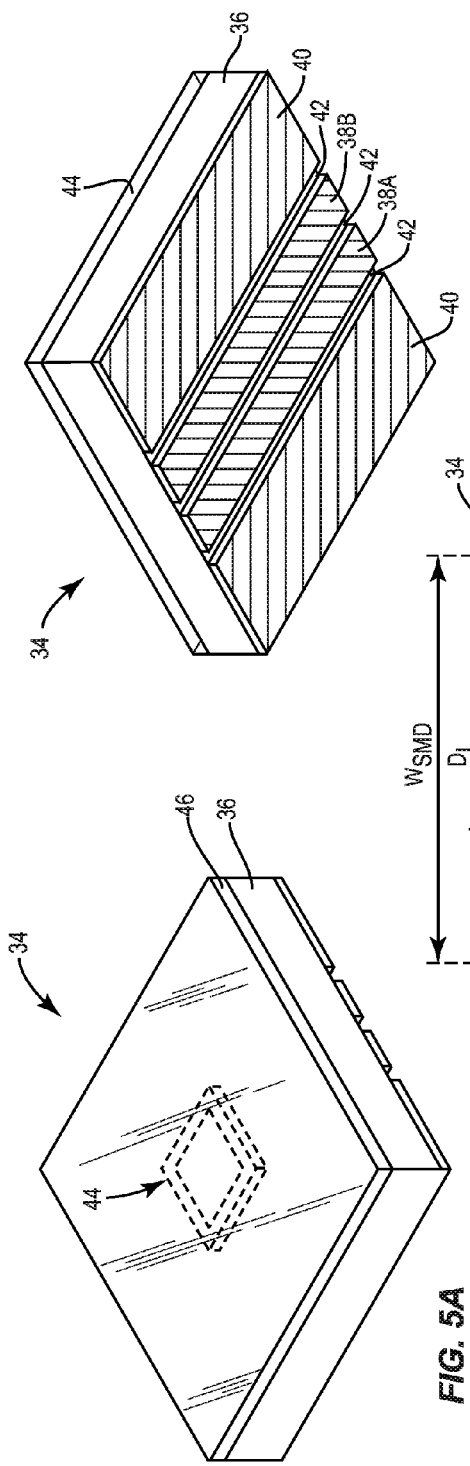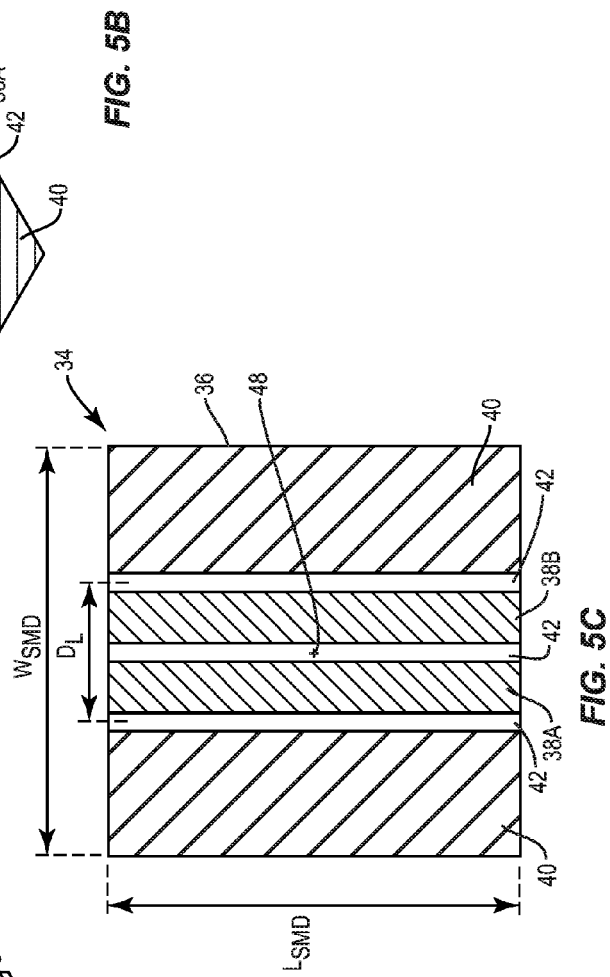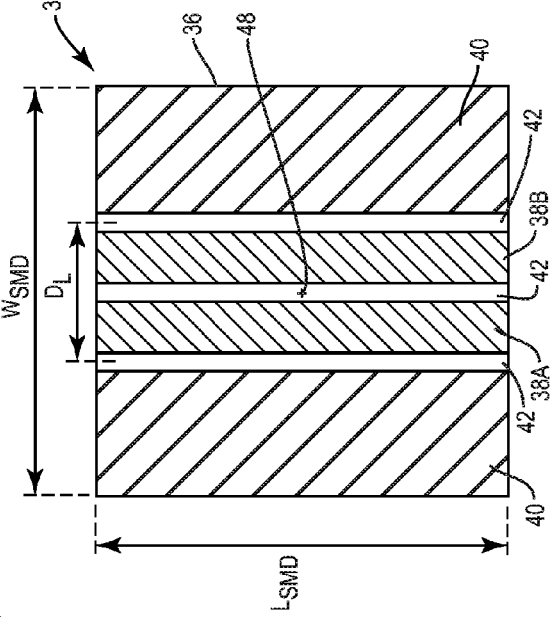
FIG. 5A
FIG. 5B
FIG. 5C

SURFACE MOUNT DEVICE WITH STRESS MITIGATION MEASURES

FIELD OF THE DISCLOSURE

The present disclosure relates to surface mount devices, and in particular, to surface mount devices designed to reduce stress on the connection points between the surface mount device and a carrier.

BACKGROUND

Modern electronics make heavy use of surface mount devices (SMDs) due to their small size, high component density, low manufacturing cost, and enhanced performance when compared to conventional devices such as through-hole devices. FIGS. 1A through 1C illustrate a conventional SMD 10 including a substrate 12, a number of electrical contacts 14, a thermal pad 16, and a solder mask 18 on a first surface of the substrate 12, a number of components 20 on a second surface of the substrate 12 opposite the first surface, and an encapsulant layer 22 over the second surface of the substrate 12. The components 20 may form an emitter configured to generate light in response to an electrical current. For example, the components 20 may include one or more light emitting diodes (LEDs). Accordingly, the encapsulant layer 22 may be transparent in order to pass light generated by the components 20. The electrical contacts 14 are coupled to the components 20 by one or more vias (not shown) running through the substrate 12. The electrical contacts 14 may include a first electrical contact 14A, which may be an anode contact for one or more LEDs in the components 20, and a second electrical contact 14B, which may be a cathode contact for one or more LEDs in the components 20.

Generally, SMDs are permanently attached to a carrier such as a printed circuit board (PCB) via an electrically conductive material such as solder (e.g., lead/tin solder, gold/tin solder, or any other suitable compound). FIG. 2 shows a connection 24 between one of the electrical contacts 14 and a corresponding electrical contact 26 on a surface of a carrier 28 to which the conventional SMD 10 is attached. The connection 24 may primarily be formed of solder 30, and may include an intermetallic layer 32 at the interface between each one of the electrical contact 14 and the corresponding electrical contact 26 on the surface of the carrier 28. The intermetallic layer 32 may be formed at each end of the solder 30 due to mixing of the solder 30 with a surface finish covering each one of the electrical contact 14 and the corresponding electrical contact 26 on the surface of the carrier 28, and may be a weak point of the connection 24 in many cases.

While the electrical contacts 14 are connected as required to form a circuit on the carrier 28, the remaining surface area of the conventional SMD 10 such as the thermal pad 16 is generally coupled to an electrically inactive portion of the carrier 28 in order to conduct heat away from the conventional SMD 10. Because a majority of the heat produced by SMDs is generally focused at a center point of the device, thermal pads are often located at or near the center of the device while electrical contacts are located near the outside edges of the device. The various contacts of the SMD and the thermal pad 16 are physically separated such that they are electrically isolated from one another. The solder mask 18 is optional, and may provide additional electrical isolation. The thermal pad 16 may be electrically inactive when the conventional SMD 10 is not mounted, however, in certain situations the conventional SMD 10 may be mounted such that one or more of the electrical contacts 14 are coupled to the thermal pad 16 or coupled to one another through the thermal pad 16. For example, in some cases the conventional SMD 10 may include a number of electrical contacts 14 coupled to the same or different components 20 on the second surface of the substrate 12 in order to provide different functionality of the conventional SMD 10 device depending on the particular electrical contacts 14 used to connect the device to a circuit. For example, the conventional SMD 10 may include at least four electrical contacts 14 such that a number of LEDs are coupled in series between a first pair of the electrical contacts, while at least some of the LEDs are connected in parallel between a second pair of the electrical contacts. Accordingly, the conventional SMD 10 may operate at different voltages depending on the particular configuration of the electrical contacts 14 connected to a circuit.

When the conventional SMD 10 is bonded to the carrier 28, differences in the coefficient of thermal expansion (CTE) between the substrate 12 of the conventional SMD 10, the solder 30, and the carrier 28 generate mechanical stress as the temperature of the conventional SMD 10 and/or the carrier 28 changes. This mechanical stress is lowest at the center point of the conventional SMD 10 and increases in a linear fashion with the distance from the center point as illustrated in the graph shown in FIG. 3. Accordingly, the edges of the conventional SMD 10 experience the greatest amount of stress and are the most prone to separating from the carrier 28. As mechanical stress between the various parts of the conventional SMD 10 and the carrier 28 rises above a critical point, the conventional SMD 10 separates from the carrier 28 beginning at the edges of the conventional SMD 10 and propagating inward towards the center point, as shown in FIG. 4. Generally, this separation will occur at the intermetallic layer 32 between the electrical contact 26 on the carrier 28 and the solder 30.

FIG. 4 specifically shows the conventional SMD 10 at three different points in time (T1, T2, and T3), at which larger portions of the electrical contacts 14 and/or the thermal pad 16 of the conventional SMD 10 have separated from the carrier 28. At each of T1, T2, and T3, the portions of the electrical contacts 14 and/or the thermal pad 16 outside of the respective dashed circles has detached from a corresponding contact on the carrier 28. After a portion of the electrical contacts 14 and/or the thermal pad 16 of the conventional SMD 10 has separated from the carrier 28, the separation of that particular electrical contact 14 and/or thermal pad 16 accelerates due to the fact that the connection 24 between the conventional SMD 10 and the carrier 28 has been compromised. Accordingly, once separation of the conventional SMD 10 from the carrier 28 begins, there may be little time before the conventional SMD 10 fails altogether. While the conventional SMD 10 may remain functional at T1 and T2 due to the fact that the electrical contacts 14 are still connected to the carrier 28, the conventional SMD 10 is no longer electrically connected to the carrier 28 at time T3 and thus is no longer functional. At some point in time after T3, the conventional SMD 10 may completely separate from the carrier 28.

A failure of the connection 24 between the conventional SMD 10 and the carrier 28 is dependent on many factors. Generally, a failure of the connection 24 will be accelerated due to high temperature operation and/or a large number of thermal cycles (i.e., heat up and cool down) of the conventional SMD 10 through a mechanism known as fatigue creep. Metallurgical factors such as the formation of intermetallic compounds may also weaken the connection 24 and contribute to a failure. Further, imperfections in the connection such as solder voids may alter the rate of fatigue creep, thereby affecting when a failure of the connection 24 occurs.

In light of the above, an SMD with stress mitigation measures is needed in order to reduce the failure rate of SMDs due to separation of one or more electrical contacts thereof from a PCB.

SUMMARY

The present disclosure relates to surface mount devices (SMDs), and in particular to SMDs designed to reduce stress on the connection points between the SMD and a carrier. In one embodiment, an SMD includes a substrate and one or more electrical contacts on a first surface of the substrate. Each one of the electrical contacts are configured to couple to a corresponding electrical contact located on a surface of a carrier, and are located within a lateral distance from a center point of the substrate that is less than about 50% of a total width of the first surface. By providing the electrical contacts within the lateral distance, the mechanical stress experienced by the electrical contacts can be significantly reduced when compared to conventional SMDs including electrical contacts on the outer edges thereof. Accordingly, the failure rate of the SMD due to separation of one or more of the electrical contacts from the carrier may be reduced.

In one embodiment, the lateral distance is less than about 25% of the total width of the first surface.

In one embodiment, the SMD is a light emitting diode (LED).

In one embodiment, the one or more electrical contacts are physically separated from one another. In an additional embodiment, the one or more electrical contacts are separated by a solder mask. The SMD may further include a thermal pad, which is located on the outer edges of the first surface. The thermal pad may be physically separated from the one or more electrical contacts. In one embodiment, the thermal pad is physically separated from the one or more electrical contacts by the solder mask. The thermal pad may be physically separated into a number of sections. In one embodiment, the thermal pad is physically separated into a number of sections by the solder mask. Separating the thermal pad into sections creates one or more mechanical "breaks" in the thermal pad whereby mechanical defects formed in one section of the thermal pad due to mechanical stress can terminate before propagating to other sections thereof or to the electrical contacts. Accordingly, the failure rate of the SMD due to separation of one or more of the electrical contacts from the carrier may be reduced.

In one embodiment, the SMD further includes one or more components on a second surface of the substrate opposite the first surface. The one or more components may be electrically coupled to one or more of the electrical contacts by one or more vias running through the substrate. The SMD may further include an encapsulant layer over the second surface of the substrate.

In one embodiment, each one of the electrical contacts is physically separated into at least two sections. Each one of the electrical contacts may be separated by the solder mask. Separating each one of the electrical contacts into at least two sections creates a mechanical "break" between the separate sections of the particular electrical contact, thereby preventing mechanical defects in one section of an electrical contact from propagating throughout the entire electrical contact.

In one embodiment, an SMD includes a substrate and one or more electrical contacts on a first surface of the substrate. Each one of the electrical contacts are configured to couple to a corresponding electrical contact located on a surface of a carrier, and are located within a concentric area of the first surface that is less than about 50% of a total area of the first surface. By providing the electrical contacts within the concentric area, the mechanical stress experienced by the electrical contacts can be significantly reduced when compared to conventional SMDs including electrical contacts on the outer edges thereof. Accordingly, the failure rate of the SMD due to separation of one or more of the electrical contacts from the carrier may be reduced.

In one embodiment, the concentric area is less than about 25% of the total area of the first surface.

In one embodiment, the SMD further includes a thermal pad on the first surface of the substrate, which is physically separated from the electrical contacts. The thermal pad may be separated from the electrical contacts via the solder mask. The thermal pad may be further separated into a first section and a second section such that the first section of the thermal pad surrounds the electrical contacts, while the second section of the thermal pad surrounds the first section. The solder mask may separate the first section and the second section of the thermal pad. In an additional embodiment, the thermal pad is physically separated into any number of sections. Separating the thermal pad into a number of different sections creates one or more mechanical "breaks" whereby mechanical defects formed in one section of the thermal pad due to stress can terminate before propagating to other sections thereof or to the electrical contacts. Accordingly, the failure rate of the SMD due to separation of one or more of the electrical contacts from the carrier may be reduced.

In one embodiment, the SMD further includes one or more components on a second surface of the substrate opposite the first surface. The one or more components may be electrically coupled to one or more of the electrical contacts by one or more vias running through the substrate. The SMD may further include an encapsulant layer over the second surface of the substrate.

In one embodiment, each one of the electrical contacts has a circular perimeter.

In one embodiment, each one of the electrical contacts is physically separated into at least two sections. Each one of the electrical contacts may be separated by the solder mask. Separating each one of the electrical contacts into at least two sections creates a mechanical "break" between the separate sections of the particular electrical contact, thereby preventing fractures in one section of an electrical contact from propagating throughout the entire electrical contact.

In one embodiment, an SMD includes a substrate and one or more electrical contacts on a first surface of the substrate. The electrical contacts are each configured to be coupled to a corresponding electrical contact on a surface of a carrier, and are physically separated into at least two sections (e.g., by a solder mask). By breaking the electrical contacts into at least two sections, a mechanical "break" is formed between the separate sections of the electrical contact. Accordingly, a fracture in one section of a particular electrical contact will be prevented from propagating throughout the entire electrical contact, thereby reducing the failure rate of the SMD due to separation of the electrical contact from the PCB.

In one embodiment, the SMD further includes a thermal pad on the first surface of the substrate, which is physically separated from the electrical contacts. The thermal pad may be separated from the electrical contacts via the solder mask.

The thermal pad may be further separated into a first section and a second section such that the first section of the thermal pad surrounds the electrical contacts, while the second section of the thermal pad surrounds the first section. In an additional embodiment, the thermal pad may be separated into any number of sections. Separating the thermal pad into a number of different sections creates one or more mechanical "breaks" whereby mechanical defects formed in one section of the thermal pad due to stress can terminate before propagating to other sections thereof or to the electrical contacts. Accordingly, the failure rate of the SMD due to separation of one or more of the electrical contacts from the carrier may be reduced.

In one embodiment, the SMD further includes one or more components on a second surface of the substrate opposite the first surface. The one or more components may be electrically coupled to one or more of the electrical contacts by one or more vias running through the substrate.

In one embodiment, each one of the electrical contacts has a circular perimeter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A through 1C illustrate a conventional surface mount device (SMD).

FIGS. 5A through 5I illustrate an SMD according to one embodiment of the present disclosure.

DETAILED DESCRIPTION

Figure 2:
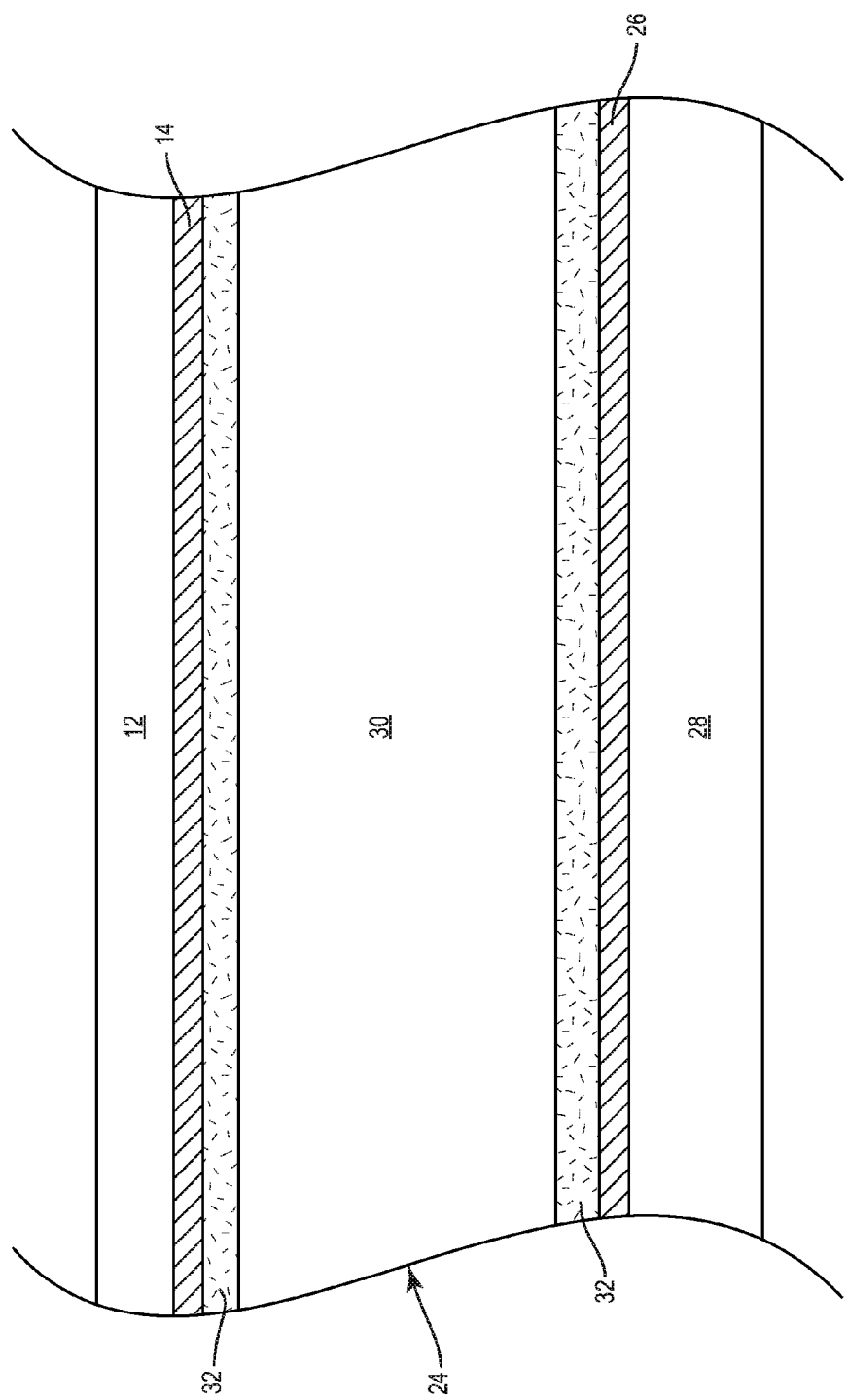
FIG. 2 illustrates a connection between the conventional SMD shown in FIG. 1 and a carrier.
Figure 3:
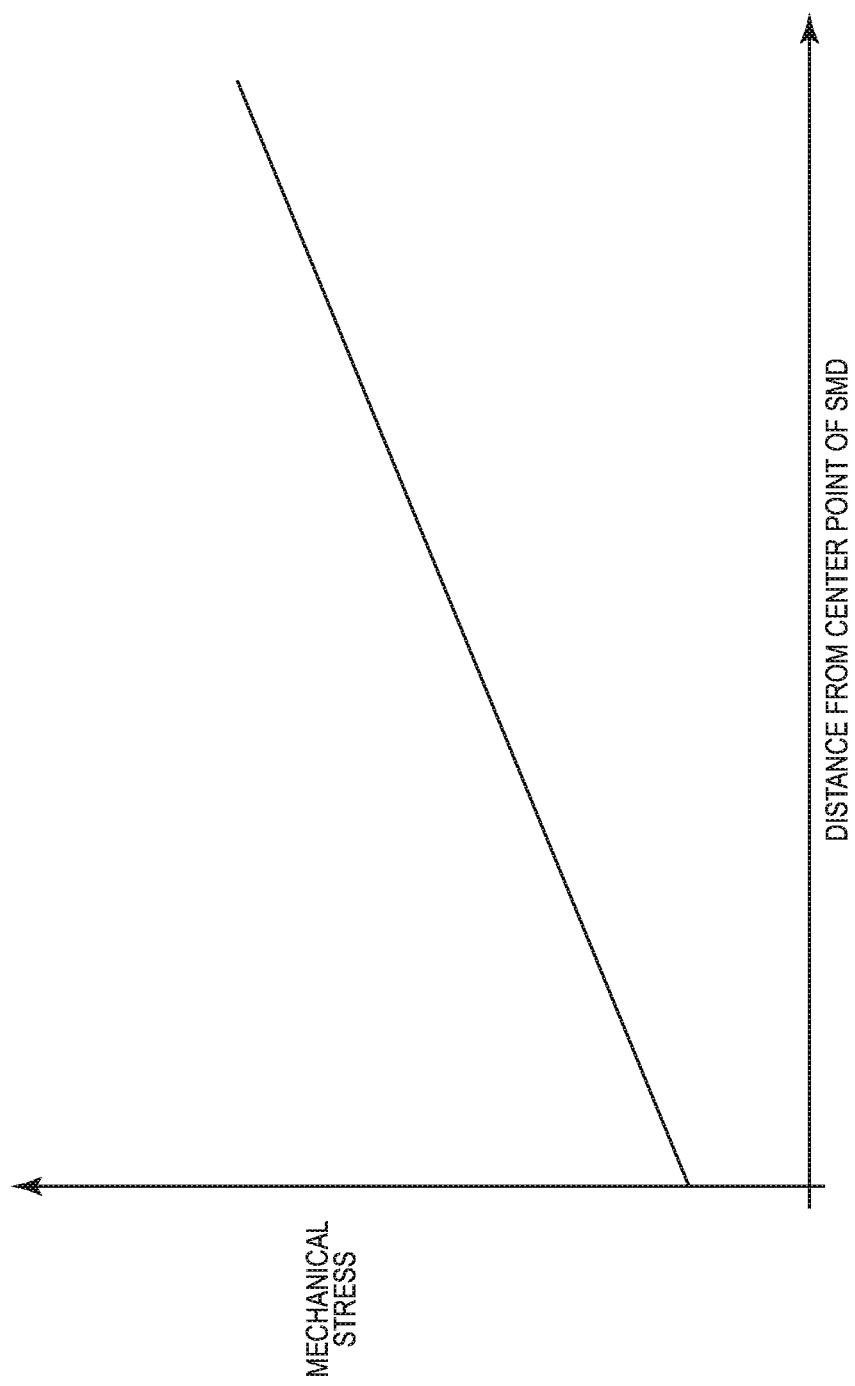
FIG. 3 is a graph illustrating the relationship of mechanical stress on an SMD in relation to a distance from a center point of the SMD.
Figure 4:
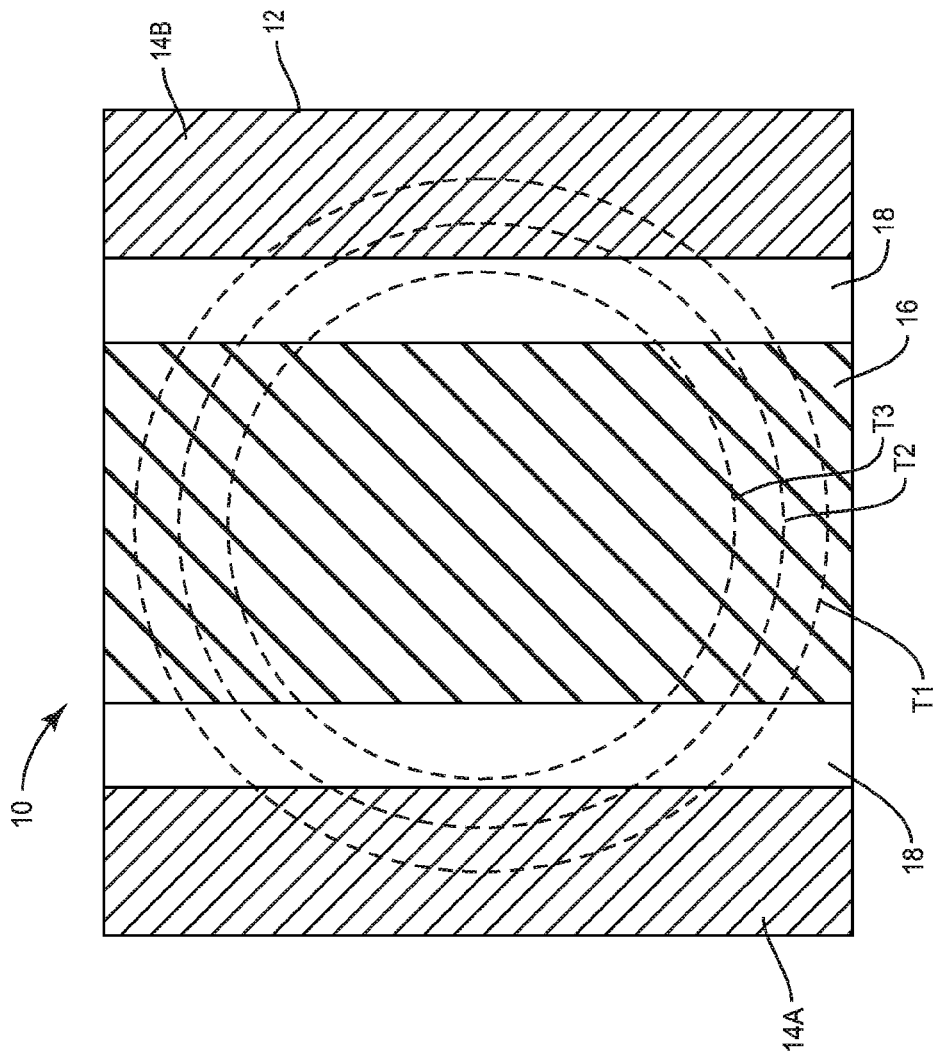
FIG. 4 illustrates a separation pattern of an SMD from a carrier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 5A through 5C show a surface mount device (SMD) 34 according to one embodiment of the present disclosure. Specifically, FIG. 5A shows an isometric top view of the SMD 34, FIG. 5B shows an isometric bottom view of the SMD 34, and FIG. 5C shows a bottom view of the SMD 34. The SMD 34 includes a substrate 36, a number of electrical contacts 38, a thermal pad 40, and a solder mask 42 on a first surface of the substrate 36, a number of components 44 on a second surface of the substrate 36 opposite the first surface, and an encapsulant layer 46 over the second surface of the substrate 36. In one embodiment, the components 44 form an emitter configured to generate light in response to an electrical current. For example, the components 44 may include one or more light emitting diodes (LEDs). Accordingly, the encapsulant layer 46 may be transparent in order to pass light generated by the components 44 in some embodiments. The electrical contacts 38 may be coupled to the components 44 by one or more vias (not shown) running through the substrate 36. In one embodiment, the electrical contacts 38 include a first electrical contact 38A and a second electrical contact 38B, wherein the first electrical contact 38A is an anode for one or more LEDs in the components 44 and the second electrode 38B is a cathode for the one or more LEDs in the components 42.

As shown in FIGS. 5B and 5C, the electrical contacts 38 are located within a lateral distance $D_L$ from a center point 48 of the SMD 34, rather than at the outside edges of the device as discussed above with respect to conventional SMDs. While the solder mask 42 is shown isolating the electrical contacts 38 from each other and from the thermal pad 40, the physical separation between the electrical contacts 38 and the thermal pad 40 may be maintained regardless of the presence of the solder mask 42. In other words, the solder mask 42 is optional, and may be omitted in various embodiments. The thermal pad 40 is located at the outside edges of the SMD 34. As discussed above, mechanical stress due to mismatches in the coefficient of thermal expansion (CTE) of the SMD and a carrier to which it is attached result in mechanical stress that increases linearly with the distance from the center point 48 of the SMD 34. By moving the electrical contacts 38 such that they are located within the lateral distance $D_L$, the electrical contacts 38 are kept close to the center point 48 of the SMD 34, thereby reducing the mechanical stress experienced by the electrical contacts 38 and reducing the likelihood that one or more of the electrical contacts 38 will separate from a corresponding electrical contact on a carrier to which the SMD 34 is attached.

In one embodiment, the first lateral distance $D_L$ is less than about 50% of a total width $W_{SMD}$ of the SMD 34. In another embodiment, the first lateral distance is less than about 25% of the total width $W_{SMD}$ of the SMD 34. In yet another embodiment, the first lateral distance $D_L$ is less than about 10% of the total width $W_{SMD}$ of the SMD 34.

The SMD 34 shown in FIGS. 5A though 5C has been simplified for purposes of illustration. Generally, the SMD 34 may include any number of additional features such as a lens for focusing light generated by the components 42, a reflector for reflecting light generated by the components 42, any number of additional functional or structural layers, and any number of conductive features for connecting various components of the SMD 34 to one another or to external circuitry. Further, while only two electrical contacts 38 are shown in the SMD 34, the principles of the present disclosure may be applied to SMDs including any number of electrical contacts 38.

Figure 5D:
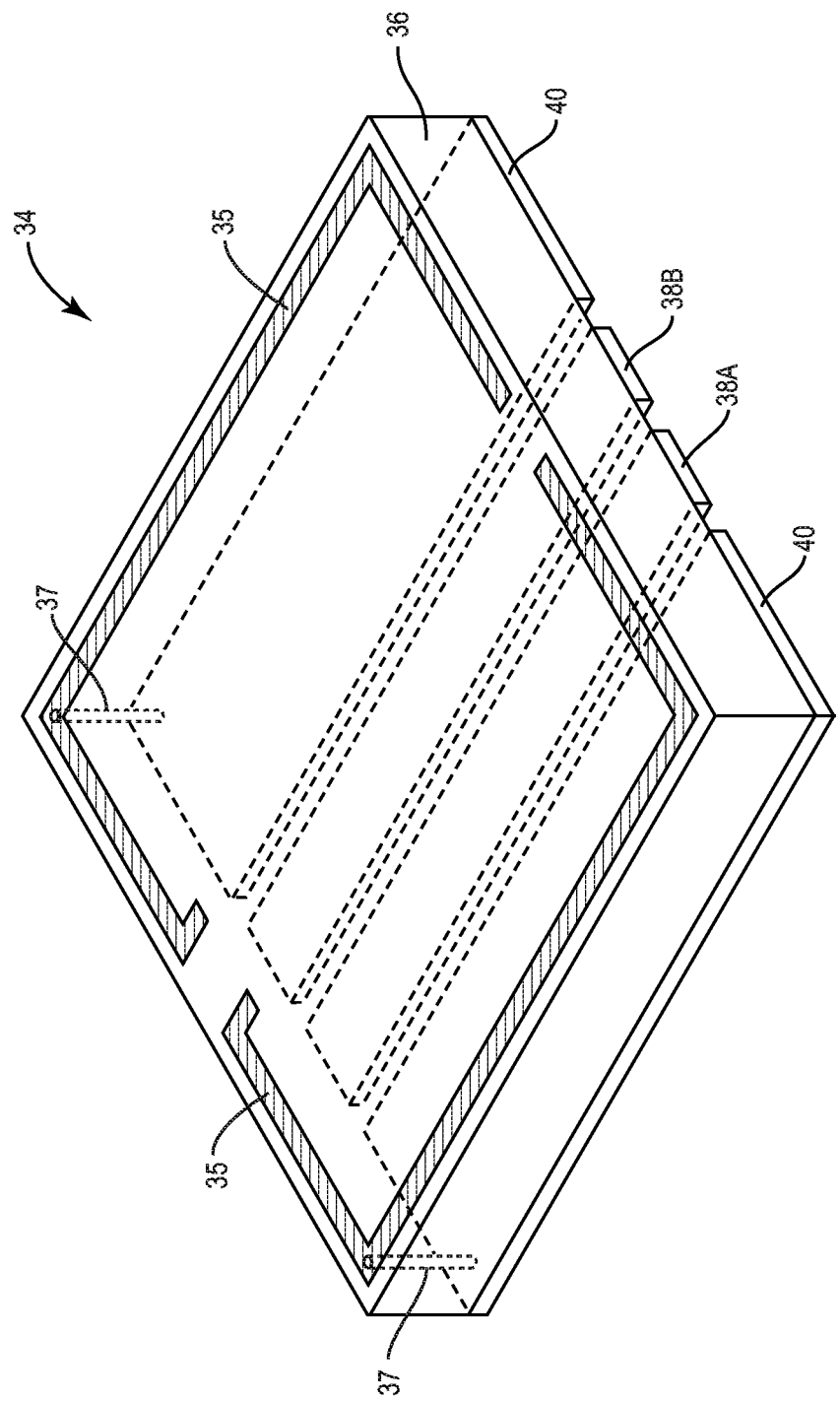

FIGS. 5D through 5I illustrate various embodiments of the substrate 36 that may be used along with the concepts described herein. Specifically, FIG. 5D illustrates the SMD 34 including a number of conductive traces 35 on the second surface of the substrate 36. The conductive traces 35 are connected to the electrical contacts 38 by one or more vias 37 running through the substrate 36 as shown. The conductive traces 35 provide a way for the components 42 to connect to the electrical contacts 38. Accordingly, the conductive traces 35 may be routed around the perimeter of the second surface of the substrate 36 in order to provide flexibility in the placement and connection of the components 42. In general, the conductive traces 35 may be provided in any desirable pattern and customized to support a particular layout of the components 42.

Figure 5E:
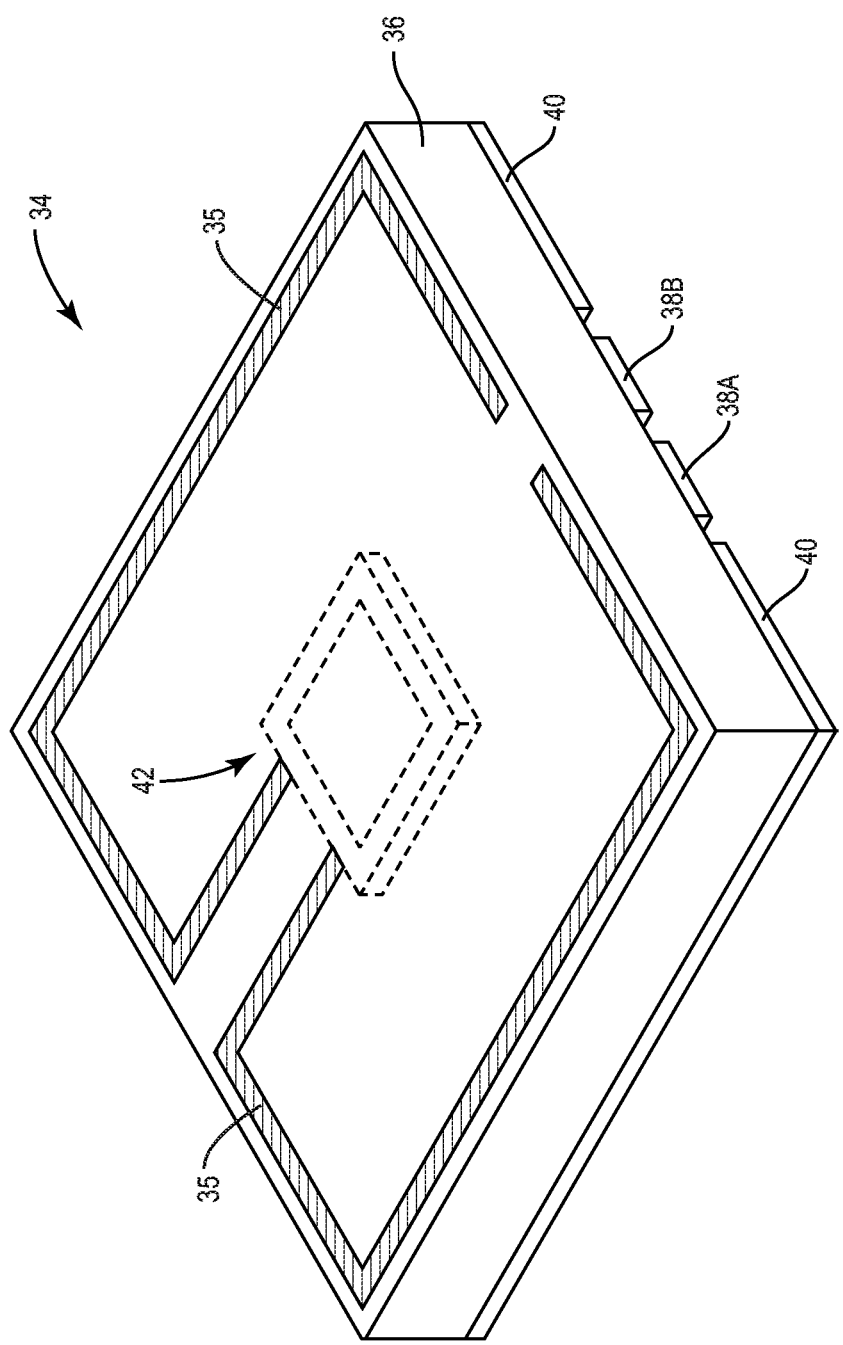

FIG. 5E illustrates the SMD 34 wherein the conductive traces 35 are arranged to support a flip chip component. As shown in FIG. 5E, a component 42 is mounted directly onto and between two of the conductive traces 35. While only one component 42 (e.g., a single-chip LED) is shown in FIG. 5E, multiple components 42 (e.g., an LED array) may be mounted on the second surface of the substrate 36 by similar means.

Figure 5F:
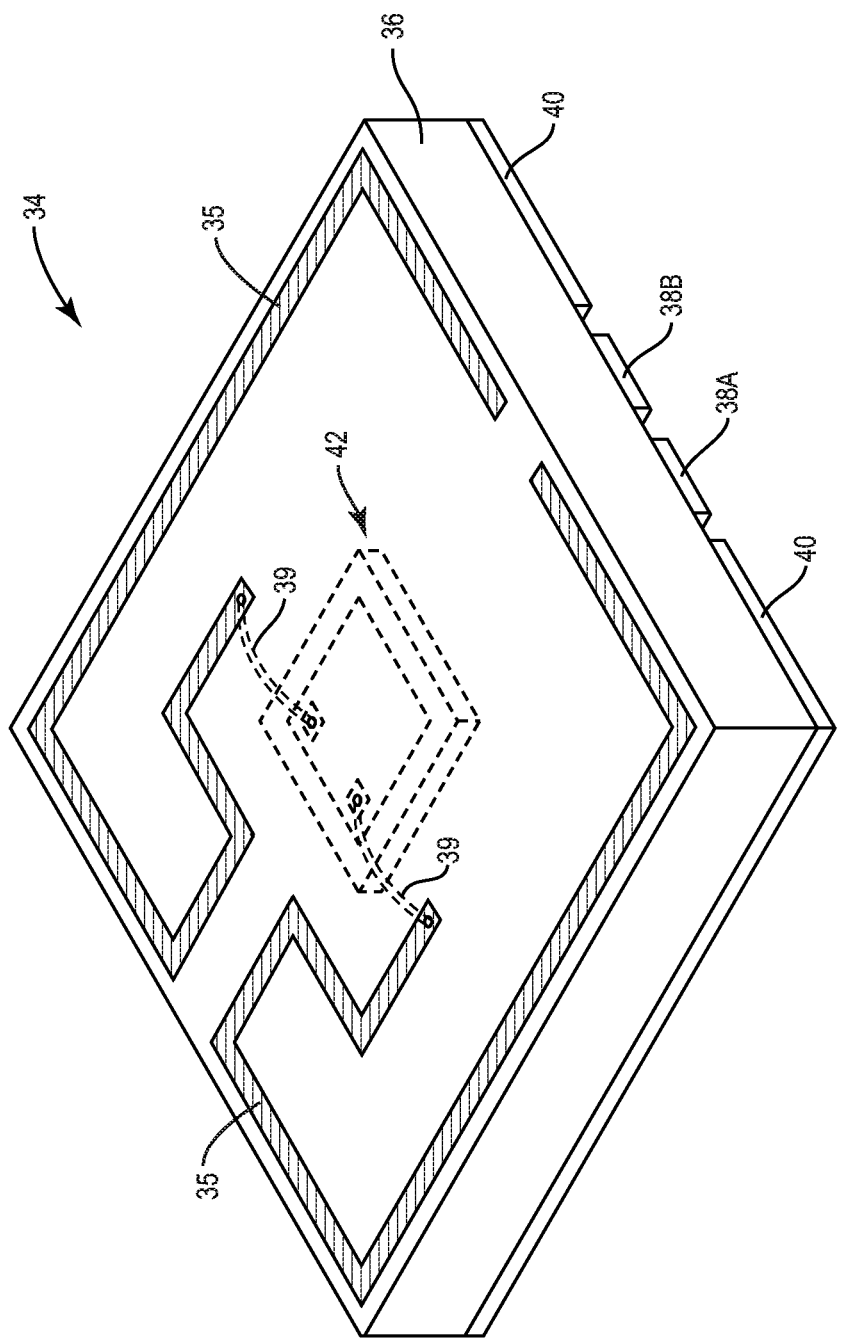
Figure 5G:
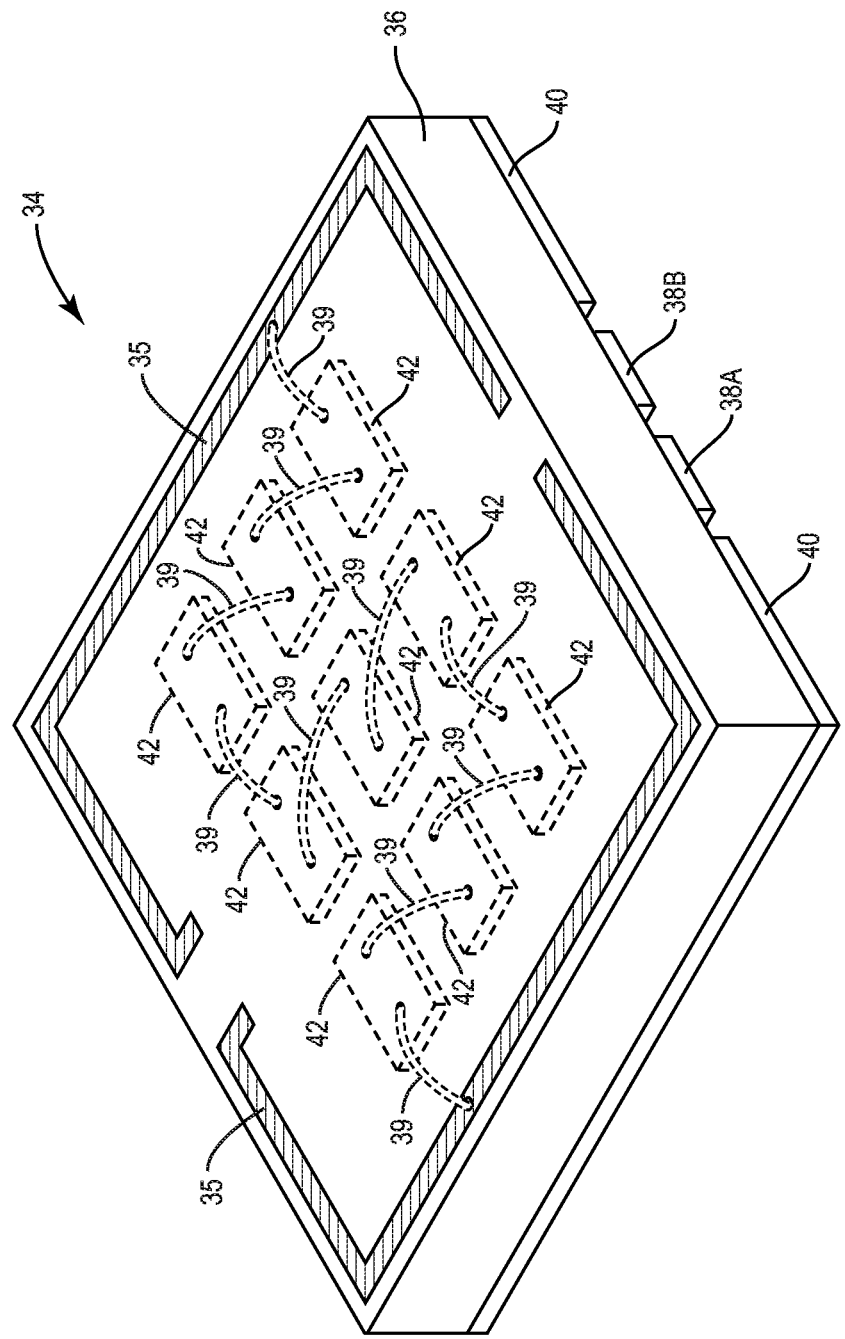

FIG. 5F illustrates the SMD 34 wherein the conductive traces 35 are arranged to support a wire bond component. As shown in FIG. 5F, a component 42 is coupled via one or more small wires 39 to the conductive traces. The component 42 may be a single-chip LED. FIG. 5G illustrates the SMD 34 including an array of components 42 coupled in series via one or more small wires 39 between two of the conductive traces 35. The components 42 may be LEDs arranged in an array as discussed above.

Figure 5H:
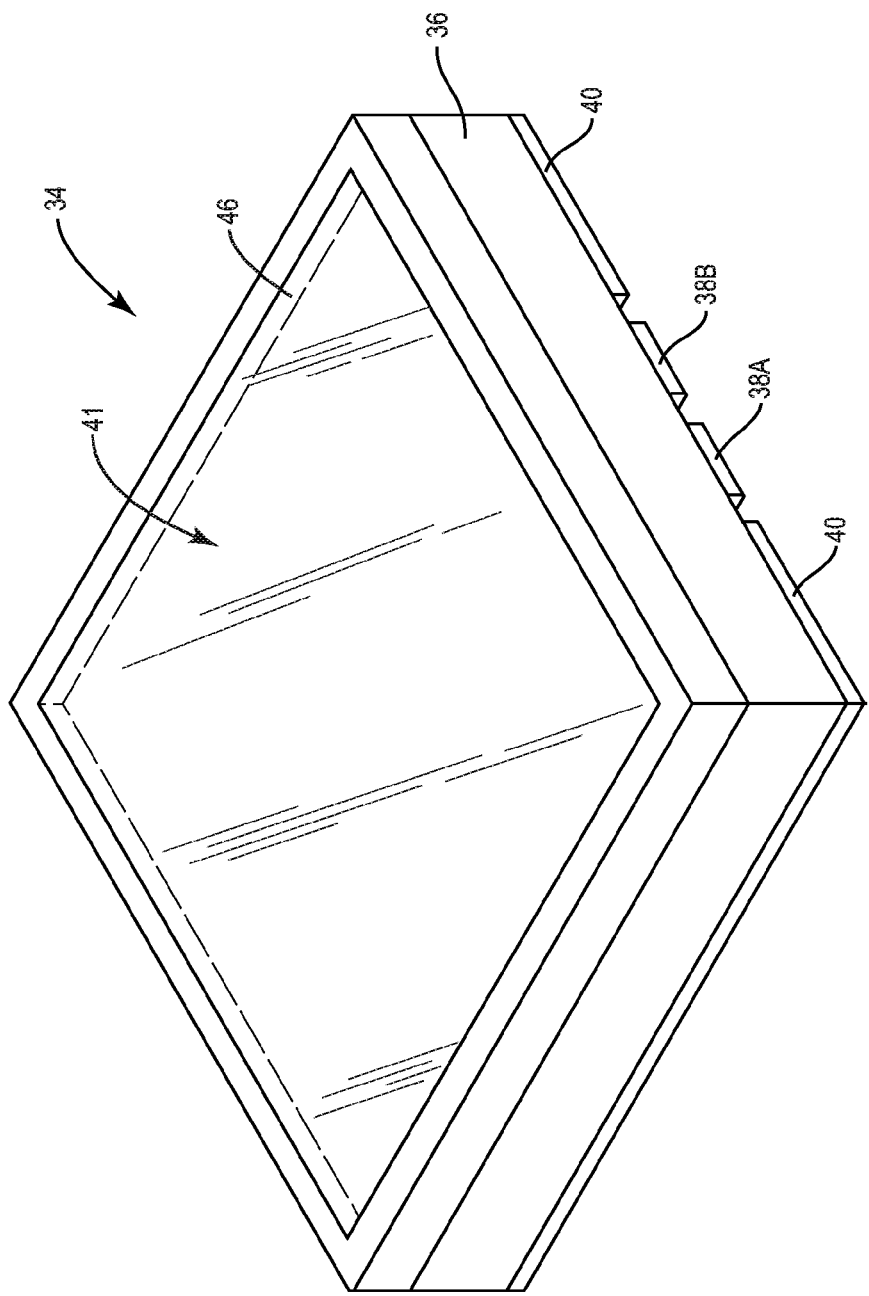

FIG. 5H illustrates the SMD 34 further including a wavelength conversion material 41. A periphery of the second surface of the substrate 36 may be extended in order to provide a reservoir in which the wavelength conversion material 41 is provided. Accordingly, the wavelength conversion material 41 is provided over the components 42 and the exposed portion of the second surface of the substrate 36. In other scenarios, a wavelength conversion material 41 may be individually provided directly onto each one of the components 42. The encapsulant layer 46 may be provided over the wavelength conversion material 41.

Wavelength conversion materials are configured to receive light having a first dominant wavelength and provide light having a second dominant wavelength that is different from the first dominant wavelength in response thereto. For example, the wavelength conversion material 41 may be a phosphor. Generally, the light having the first dominant wavelength combines with the light having the second dominant wavelength to provide light with one or more desirable characteristics such as color and color temperature. In some situations, the wavelength conversion material 41 may include multiple different wavelength conversion materials. Accordingly, the wavelength conversion material may receive the light having the first dominant wavelength and provide light having a second dominant wavelength and light having a third dominant wavelength. The light having the first dominant wavelength, the light having the second dominant wavelength, and the light having the third dominant wavelength may all combine to form light having one or more desired characteristics such as color and color temperature.

Figure 5I:
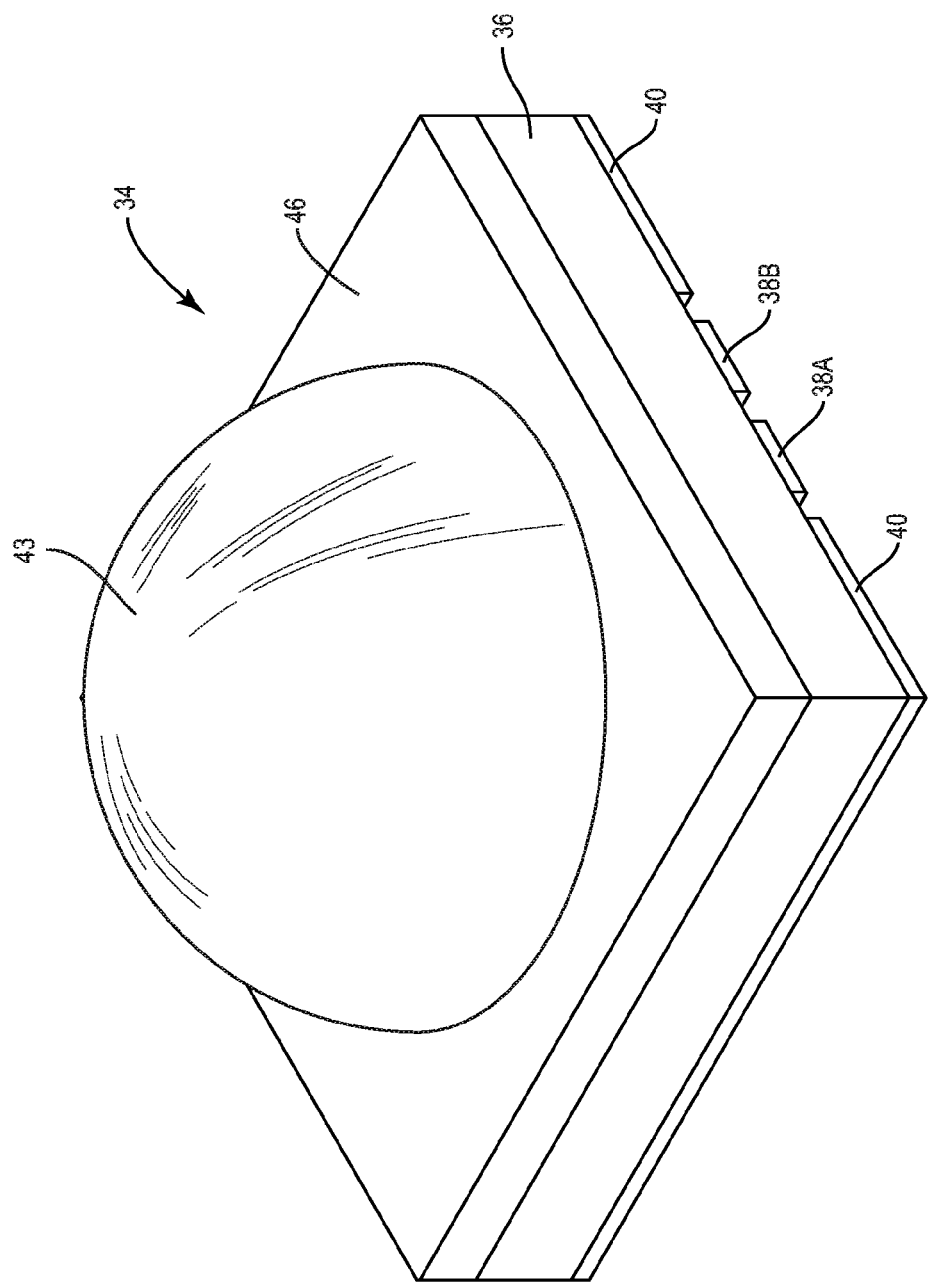

FIG. 5I illustrates the SMD 34 wherein the encapsulant layer 46 is formed into a lens 43. A mold may be used to provide the encapsulant layer 46 as shown. Accordingly, light generated by the components 42 may be focused into a desired pattern. The wavelength conversion material 41 may be provided below the encapsulant layer 46 or directly on the components 42 as discussed above.

While the SMD 34 shown in FIGS. 5A though 5I is significantly less likely to experience failure due to separation of one or more of the electrical contacts 38 from a corresponding electrical contact on a carrier to which the SMD 34 is attached due to the location of the electrical contacts 38, due to the fact that the electrical contacts 38 extend along an entire length $L_{SMD}$ of the SMD 34, a vertical portion of the electrical contacts 38 may still be located at a distance that is relatively far from the center point 48 of the SMD 34. Due to the increased amount of stress at the vertical edges of the electrical contacts 38, these vertical edges may begin to separate from a corresponding electrical contact on a carrier to which the SMD 34 is attached should the mechanical stress on the electrical contacts 38 rise above a critical threshold. As discussed above, once a connection between two electrical contacts is compromised, the mechanical defects in the connection begin to propagate more quickly through the electrical contact, resulting in a significantly reduced lifetime of an SMD.

Figure 6:
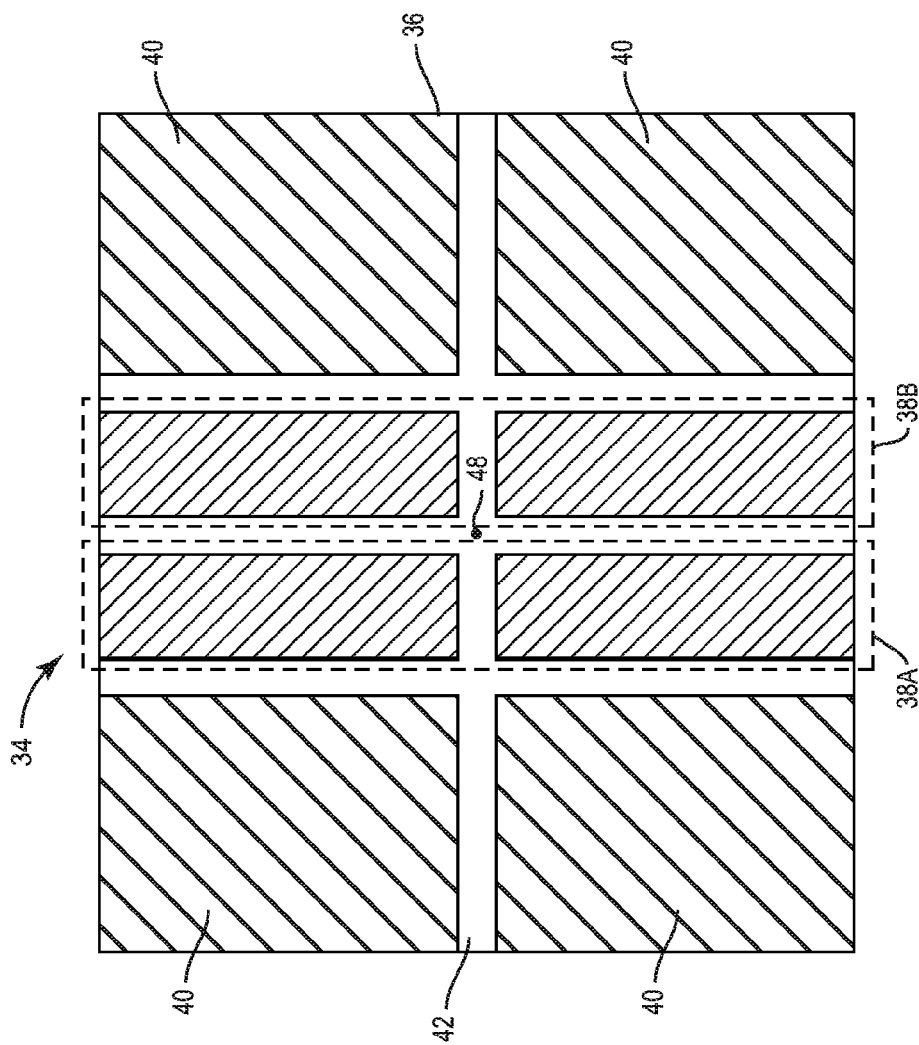
FIG. 6 illustrates an SMD according to an additional embodiment of the present disclosure.

Accordingly, FIG. 6 shows a bottom view of the SMD 34 according to an additional embodiment of the present disclosure. The SMD 34 shown in FIG. 6 is substantially similar to that shown in FIGS. 5A though 5I, except that the electrical contacts 38 and the thermal pad 40 are separated into a number of different sections by the solder mask 42. In one embodiment, the electrical contacts 38 and/or the thermal pad 40 are separated into sections in a grid-like fashion, as shown in FIG. 6, however, the present disclosure is not so limited. The electrical contacts 38 and/or the thermal pad 40 may be separated into as many or as few sections as a component designer deems fit and as any design constraints may allow. Separating the electrical contacts 38 into multiple different sections using the solder mask 42 prevents mechanical defects occurring in a connection between one section of an electrical contact 38 and a corresponding electrical contact on a surface of a carrier to which the SMD 34 is attached from propagating throughout the entire electrical contact 38 and therefore causing failure of the SMD 34.

While FIG. 6 shows only two electrical contacts 38, the SMD 34 may include any number of electrical contacts 38 without departing from the principles of the present disclosure. Each one of the electrical contacts 38 may be broken into any number of sections to reduce the likelihood of failure of the device. In one embodiment, each one of the sections corresponds with an independent electrical contact 38 such that the SMD 34 includes a relatively large number of electrical contacts 38. Each one of the electrical contacts 38 may in turn be individually coupled to an LED. Accordingly, if one of the electrical contacts 38 is disconnected from a corresponding electrical contact 38 on a surface of a carrier to which the SMD 34 is attached, the remaining electrical contacts 38 will remain attached to their corresponding LEDs and therefore the SMD 34 will continue to function, albeit in a slightly diminished capacity.

In effect, the solder mask 42 creates a number of mechanical "breaks" in each one of the electrical contacts 38, which relieve stress and stop the spread of mechanical defects throughout each one of the electrical contacts 38.

However, separating the electrical contacts 38 into multiple sections requires additional vias (not shown) to connect the various sections of each one of the electrical contacts 38 to each other and/or to one or more of the components 44. The vias required for connecting multiple sections of a single electrical contact 38 to each other and/or to one or more of the components 44 may complicate the design of the SMD 34, and further may add time and expense to the design and/or manufacture thereof. Accordingly, a designer must choose the number of sections for each one of the electrical contacts 38 based on the particular design constraints of the SMD 34. Separating the thermal pad 40 into multiple sections has a similar effect by preventing one or more large portions of the thermal pad 40 from completely separating from a carrier to which the SMD 34 is attached. Accordingly, the SMD 34 may be less likely to fail due to separation of one or more of the electrical contacts 38 from a corresponding electrical contact on a carrier to which the SMD 34 is attached.

While both the electrical contacts 38 and the thermal pad 40 are shown separated into multiple sections in FIG. 6 for purposes of brevity of the present disclosure, the electrical contacts 38 may be separated into a number of sections independently of the thermal pad 40, and vice-versa, without departing from the principles of the present disclosure.

Figure 7:
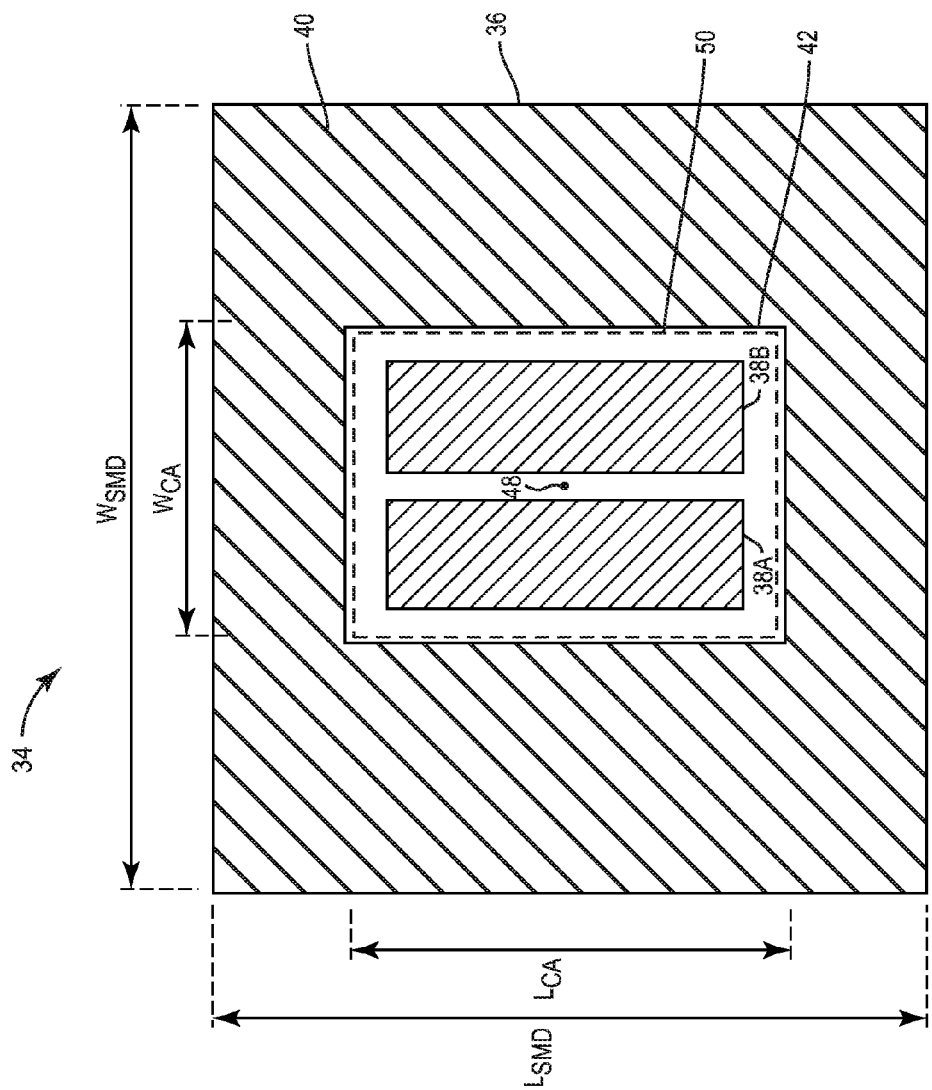
FIG. 7 illustrates an SMD according to an additional embodiment of the present disclosure.

FIG. 7 shows a bottom view of the SMD 34 according to an additional embodiment of the present disclosure. The SMD 34 shown in FIG. 7 is substantially similar to that shown in FIGS. 5A though 5I, however, the electrical contacts 38 of the SMD 34 shown in FIG. 7 are arranged differently from those discussed above. Specifically, the electrical contacts 38 of the SMD 34 are provided within a concentric area 50 of the first surface of the substrate 36. As will be appreciated by those of ordinary skill in the art, a concentric area is one that is an area of a surface that is included within a total area of the surface and centered around a center point of the surface. The concentric area 50 is defined by a concentric area width $W_{CA}$ and a concentric area length $L_{CA}$, while the total area of the first surface is defined by the width $W_{SMD}$ of the SMD 34 and the length $L_{SMD}$ of the SMD 34. Arranging the electrical contacts 38 such that they are located within the concentric area 50 significantly reduces the mechanical stress experienced by the electrical contacts 38, thereby reducing the likelihood of failure of the SMD 34 due to separation of one or more of the electrical contacts 38 from a corresponding electrical contact on a surface of a carrier to which the SMD 34 is attached.

In one embodiment, the concentric area 50 is less than about 50% of the total area of the first surface of the substrate 36. That is, the concentric area width $W_{CA}$ multiplied by the concentric area length $L_{CA}$ is about 50% less than the width $W_{SMD}$ of the SMD 34 multiplied by the length $L_{SMD}$ of the SMD 34. In some embodiments, the concentric area width $W_{CA}$ is individually less than 50% of the total width $W_{SMD}$ of the SMD 34 while the concentric area length $L_{CA}$ is individually less than 50% of the total length $L_{SMD}$ of the SMD. In an additional embodiment, the concentric area 50 is less than about 25% of the total area of the first surface of the substrate 36. In yet another embodiment, the concentric area 50 is less than about 10% of the total area of the first surface of the substrate 36.

Figure 8:
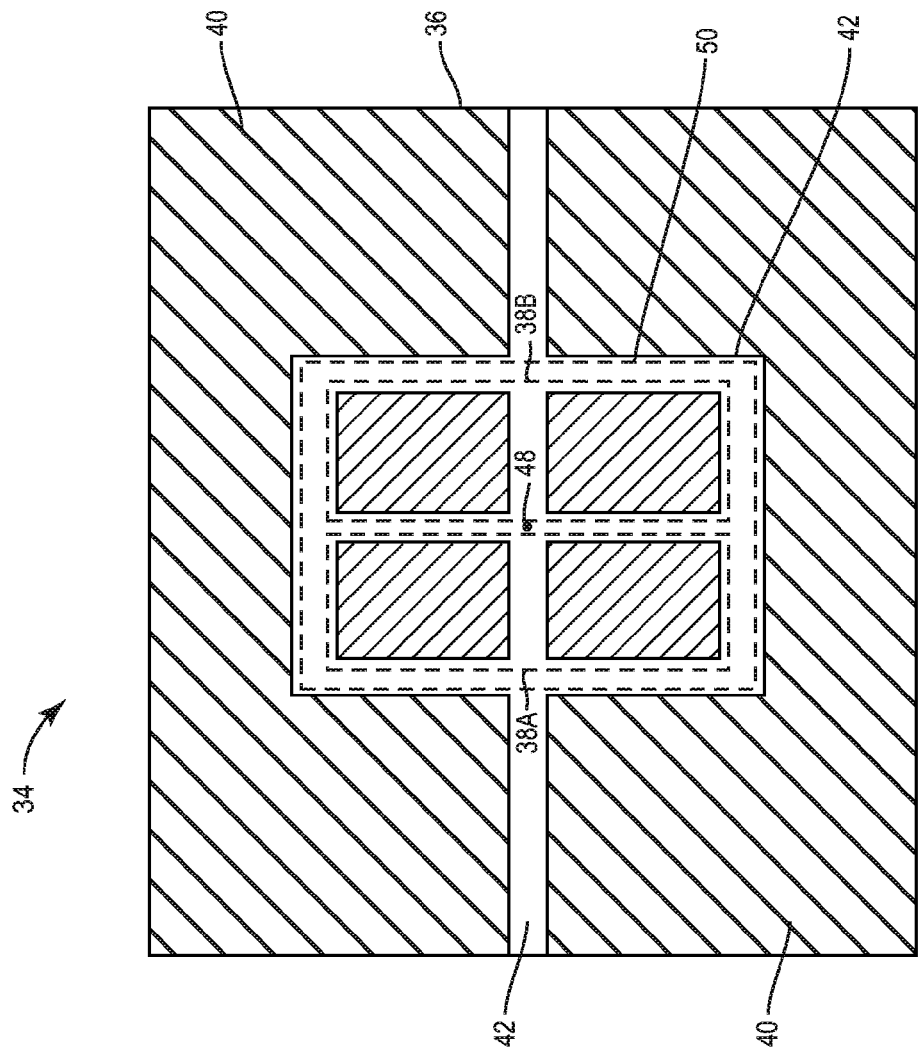
FIG. 8 illustrates an SMD according to an additional embodiment of the present disclosure.

FIG. 8 shows a bottom view of the SMD 34 according to an additional embodiment of the present disclosure. The SMD 34 shown in FIG. 8 is substantially similar to that shown in FIG. 7, except that the electrical contacts 38 and the thermal pad 40 of the SMD 34 are separated into a number of different sections by the solder mask 42. In one embodiment, the electrical contacts 38 and/or the thermal pad 40 are separated into sections in a grid-like fashion, as shown in FIG. 8, however, the present disclosure is not so limited. The electrical contacts 38 and/or the thermal pad 40 may be separated into as many or as few sections as a designer deems fit and as any design constraints may allow, and further may be separated using any desired pattern. As discussed above, separating the electrical contacts 38 into multiple different sections using the solder mask 42 prevents mechanical defects occurring in a connection between one section of an electrical connection 38 and a corresponding electrical contact on a surface of a carrier to which the SMD 34 is attached from propagating throughout the entire electrical contact 38 and therefore causing failure of the SMD 34. The particular number of sections used for each one of the electrical contacts 38 must be balanced by the number of vias (not shown) required to properly connect the various sections of each electrical contact 38 as discussed above. In effect, the solder mask 42 creates a number of mechanical "breaks" in each one of the electrical contacts 38, which relieve stress and stop the spread of mechanical defects throughout each one of the electrical contacts 38. Accordingly, the likelihood of failure of the SMD 34 due to separation of one or more of the electrical contacts 38 from a corresponding electrical contact on a surface of a carrier to which the SMD 34 is attached can be significantly reduced.

Figure 9:
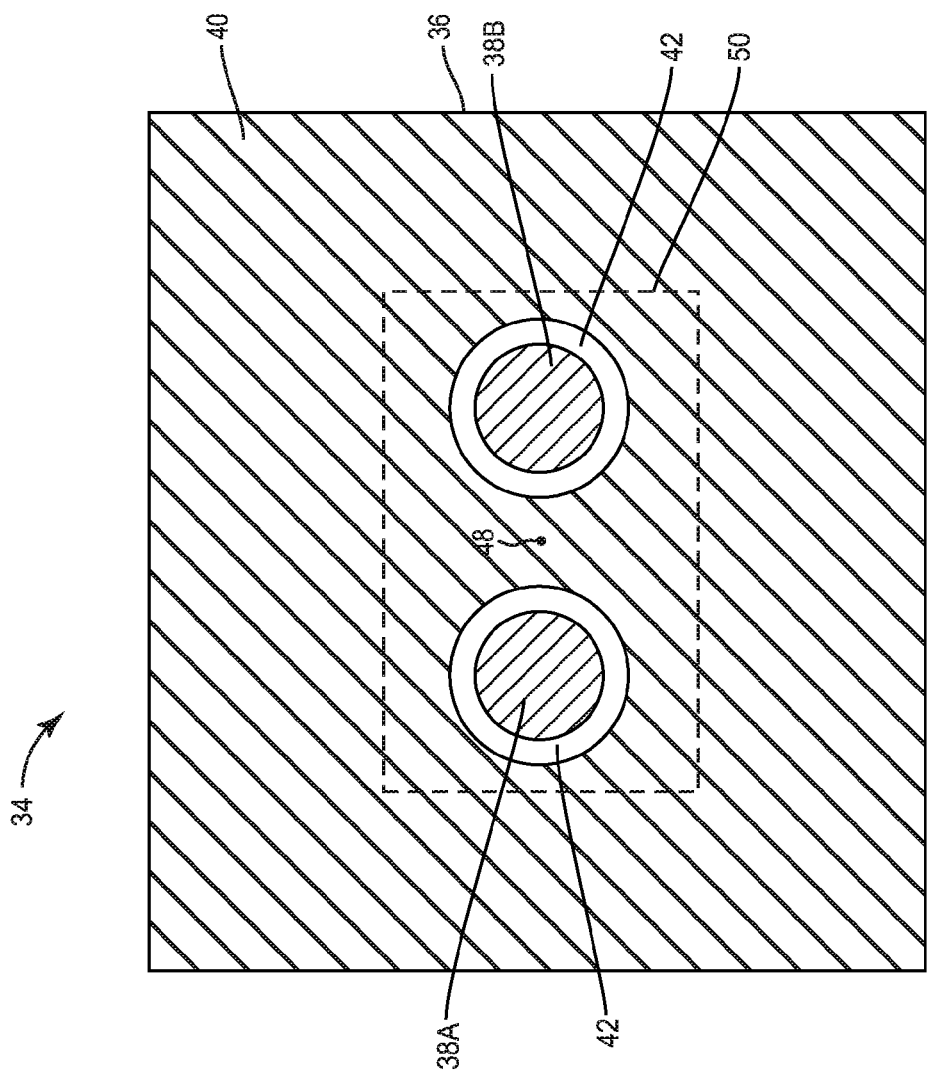
FIG. 9 illustrates an SMD according to an additional embodiment of the present disclosure.

FIG. 9 shows a bottom view of the SMD 34 according to an additional embodiment of the present disclosure. The SMD 34 shown in FIG. 9 is substantially similar to that shown in FIG. 7, however, the electrical contacts 38 of the SMD 34 shown in FIG. 9 are arranged differently from those discussed above. Specifically, the electrical contacts 38 of the SMD 34 each have a circular perimeter, and are provided within the concentric area 50 of the first surface of the substrate 36 as discussed above. Using electrical contacts 38 with a circular perimeter may decrease the total area of each one of the electrical contacts 38, thereby reducing the mechanical stress experienced by the electrical contacts 38 and therefore reducing the likelihood of failure of the SMD 34 due to separation of one or more of the electrical contacts 38 from a corresponding electrical contact on a surface of a carrier to which the SMD 34 is attached. Further, providing the electrical contacts 38 within the concentric area 50 additionally reduces the mechanical stress experienced by the electrical contacts 38. While electrical contacts 38 with a circular perimeter are shown in FIG. 9, any number of shapes may be used to define the perimeter of the electrical contacts 38, for example, polygons, diamonds, triangles, and the like, without departing from the principles of the present disclosure.

Notably, the thermal pad 40 surrounds the electrical contacts 38, and further runs between the electrical contacts 38. Accordingly, the thermal pad 40 is in contact with the center point of the SMD 34, which is where a majority of heat is generated. In such a configuration, the thermal pad 40 may be more capable of dissipating heat generated by the components 44 and therefore increase the performance of the SMD 34.

Figure 10:
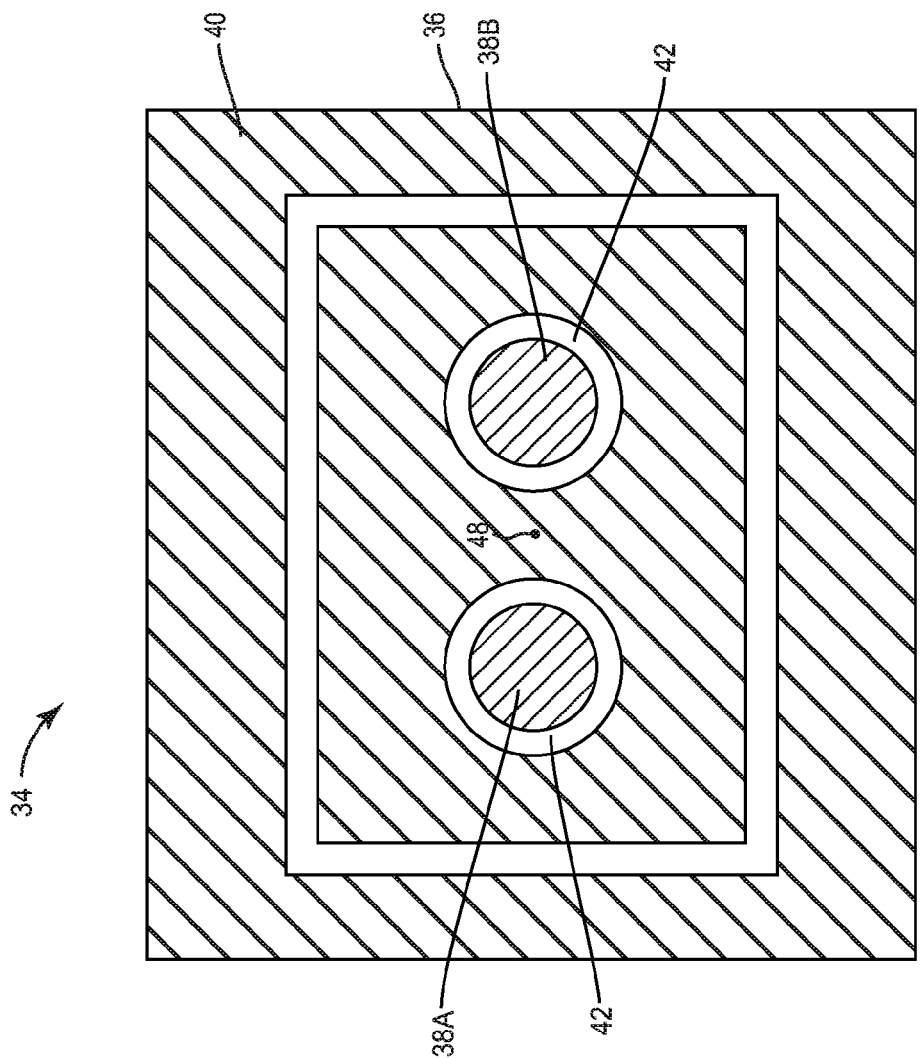
FIG. 10 illustrates an SMD according to an additional embodiment of the present disclosure.

FIG. 10 shows a bottom view of the SMD 34 according to an additional embodiment of the present disclosure. The SMD 34 shown in FIG. 10 is substantially similar to that shown in FIG. 9, however, the thermal pad 40 of the SMD 34 shown in FIG. 10 is separated into two sections by the solder mask 42. A first section of the thermal pad 40 surrounds the electrical contacts 38, while a second section surrounds the first section. The solder mask 40 separates the first section and the second section from one another. Accordingly, the solder mask 42 effectively creates a mechanical "break" in the thermal pad 40 as discussed above, which relieves stress in the thermal pad 40 and prevents the spread of mechanical defects in one section of the thermal pad 40 from propagating throughout the entirety of the thermal pad 40. Accordingly, the SMD 34 may be less likely to fail due to separation of one or more of the electrical contacts 38 from a corresponding electrical contact on a carrier to which the SMD 34 is attached. While the solder mask 42 is shown forming a single concentric rectangle around the electrical contacts 38 in FIG. 10, in various embodiments the solder mask 42 may form any number of concentric rectangles in order to further separate the thermal pad 40 into additional sections and create additional mechanical "breaks" therein.

Figure 11:
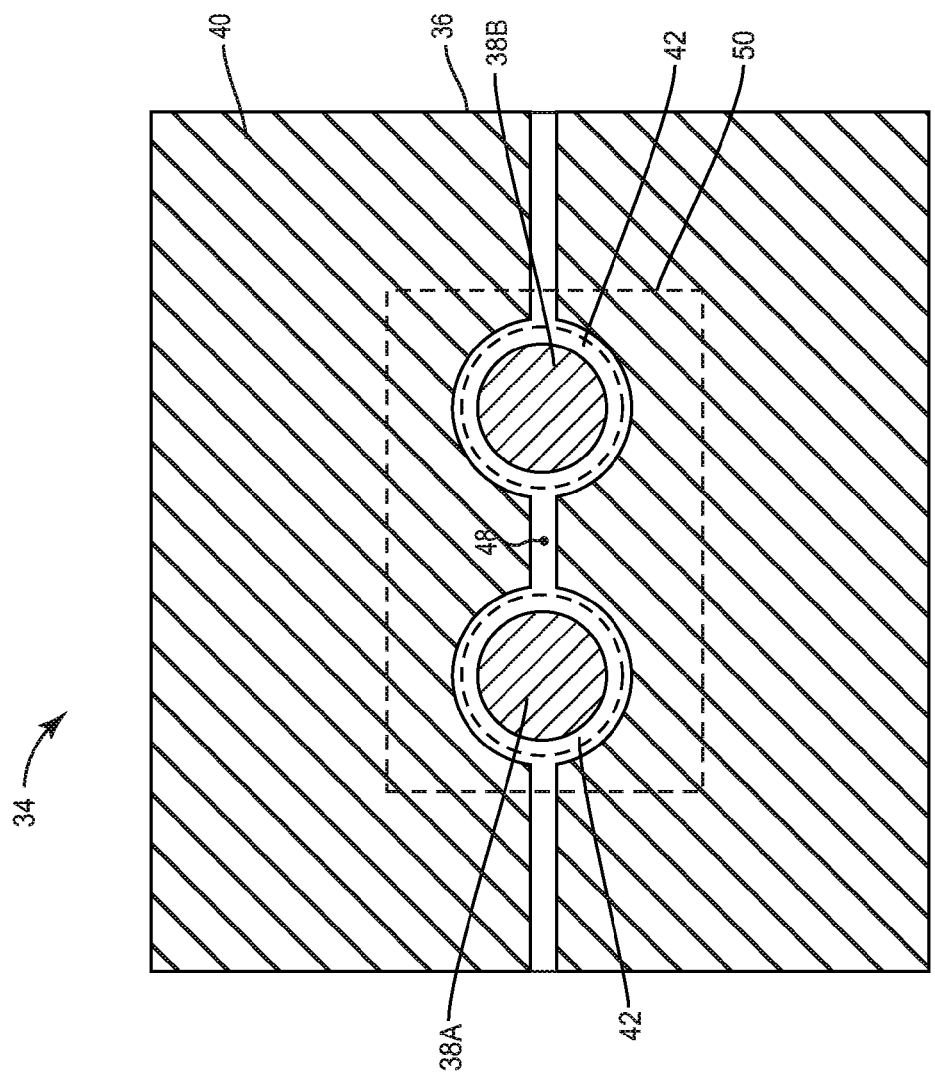
FIG. 11 illustrates an SMD according to an additional embodiment of the present disclosure.

While FIG. 10 shows a bottom view of the SMD 34 wherein the thermal pad 40 is separated into two sections, the thermal pad 40 and/or the electrical contacts 38 may be separated into as many sections as a designer may deem fit. Accordingly, FIG. 11 shows a bottom view of the SMD 34 according to an additional embodiment of the present disclosure. The SMD 34 shown in FIG. 11 is substantially similar to that shown in FIG. 10, except that the electrical contacts 38 are separated into a number of different sections, and the thermal pad 40 is separated into more than two sections. In one embodiment, the electrical contacts 38 and/or the thermal pad 40 are separated into sections in a grid-like fashion, as shown in FIG. 8, however, the present disclosure is not so limited. The electrical contacts 38 and/or the thermal pad 40 may be separated into as many or as few sections as a component designer deems fit and as any design constraints may allow, and further may be separated using any desired pattern. As discussed above, separating the electrical contacts 38 into multiple different sections using the solder mask 42 prevents mechanical defects occurring in a connection between one section of an electrical connection 38 and a corresponding electrical contact on a surface of a carrier to which the SMD 34 is attached from propagating throughout the entire electrical contact 38 and therefore causing failure of the SMD 34. The particular number of sections used for each one of the electrical contacts 38 must be balanced by the number of vias (not shown) required to properly connect the various sections of each electrical contact 38 as discussed above. In effect, the solder mask 42 creates a number of mechanical "breaks" in each one of the electrical contacts 38, which relieve stress and stop the spread of mechanical defects throughout each one of the electrical contacts 38. Accordingly, the likelihood of failure of the SMD 34 due to separation of one or more of the electrical contacts 38 from a corresponding electrical contact on a surface of a carrier to which the SMD 34 is attached can be significantly reduced.

Figure 12:
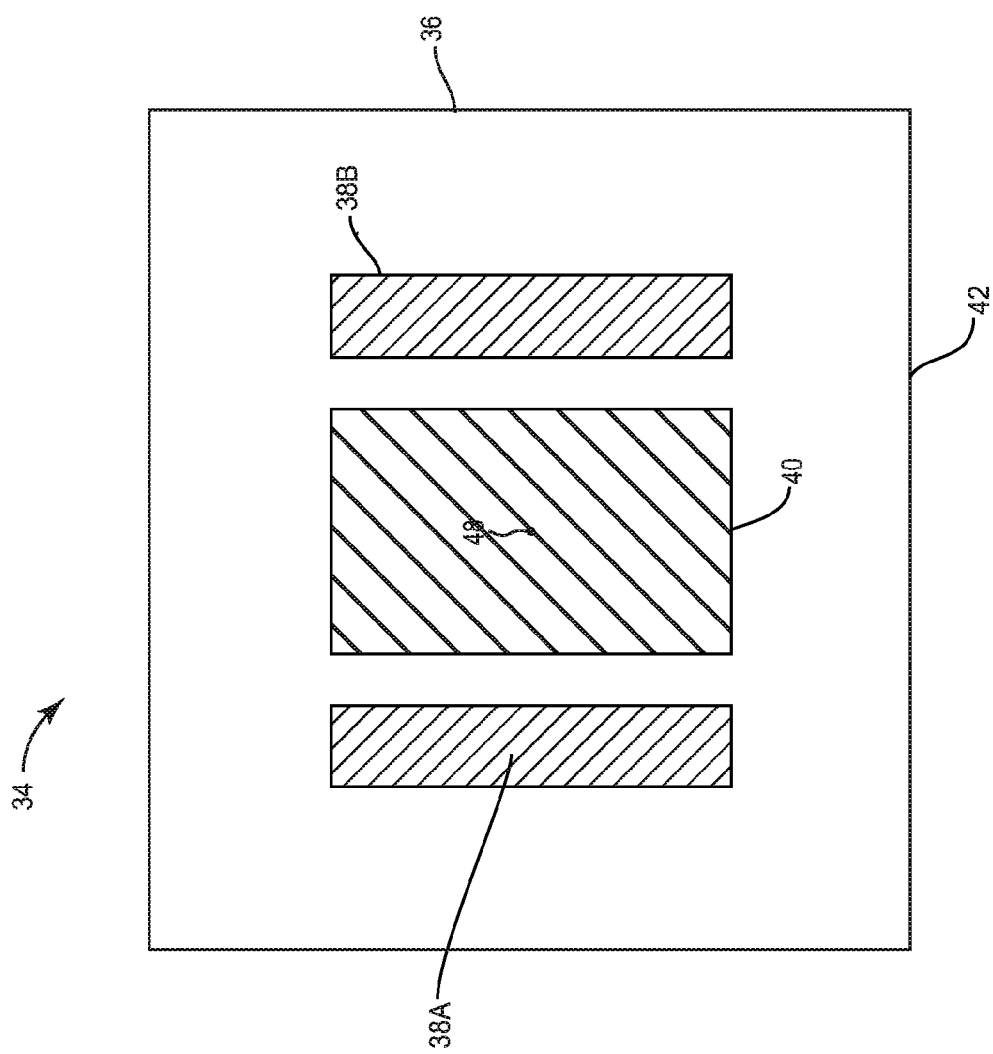
FIG. 12 illustrates an SMD according to an additional embodiment of the present disclosure.

FIG. 12 shows a bottom view of the SMD 34 according to an additional embodiment of the present disclosure. In some cases wherein a particular design of a carrier to which the SMD 34 is attached cannot be controlled or changed, it may be necessary to have the SMD 34 conform to one or more well-known patterns for the electrical contacts 38 thereof. As discussed above, however, using conventional arrangements for the electrical contacts 38 may result in failure of the SMD 34 due to separation of one or more of the electrical contacts 38 from a corresponding electrical contact on the carrier. In order to overcome this obstacle, a conventional layout for the electrical contacts 38 may be used, but at a smaller size than the substrate 36 of the SMD 34. For example, the electrical contacts 38 of a "5050" or 5 mm×5 mm part may be fanned-in to form a connection pattern that is typically used for a "3535" or 3.5 mm×3.5 mm part. Since the layout of the electrical contacts 38 is unchanged, and because the connection pattern for a 3.5 mm×3.5 mm part may be in standard use, it may be convenient to reduce the mechanical stress on the electrical contacts 38 in this way.

Figure 13:
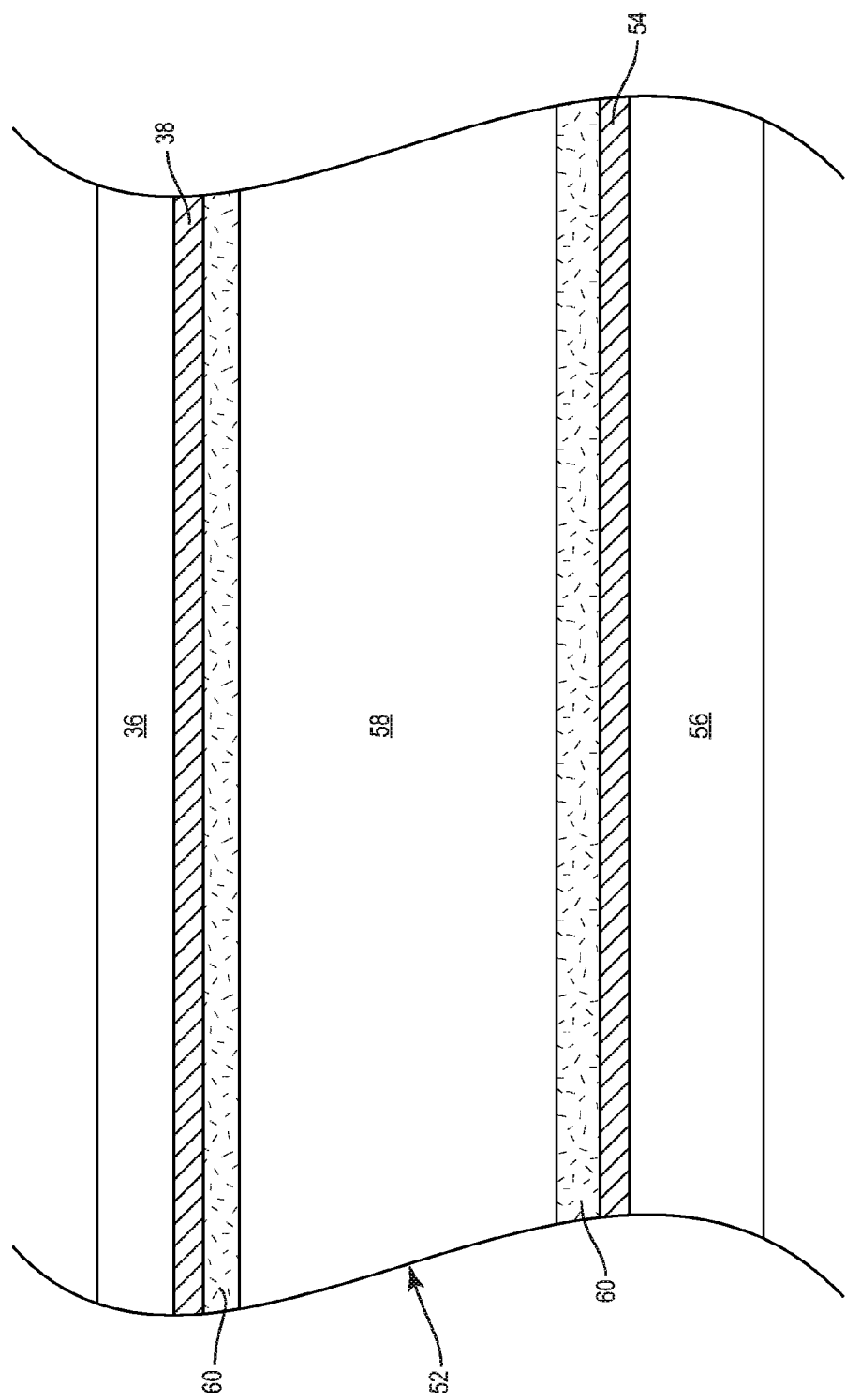
FIG. 13 illustrates a connection between the SMD shown in FIGS. 5 through 12 to a carrier according to one embodiment of the present disclosure.

FIG. 13 shows a connection 52 between one of the electrical contacts 38 and a corresponding electrical contact 54 on a surface of a carrier 56 to which the SMD 34 is attached. As discussed above, the connection 52 may primarily be formed of solder 58, with an intermetallic layer 60 at the interface between each one of the electrical contact 38 and the corresponding electrical contact 54 on the surface of the carrier 56. While arranging the electrical contacts 38 of the SMD 34 as described above may significantly reduce the likelihood of failure of the device, a number of additional measures may be taken in order to further decrease the mechanical stress experienced by the electrical contacts 38, which may be either separately employed or combined with any of the principles discussed above. Namely, choosing the particular materials for the substrate 36, the electrical contacts 38, the carrier 56, and the solder 58 may decrease the mechanical stress in the connection 52. As discussed above, a large portion of mechanical stress in the connection 52 is due to differences in the CTE of each one of the substrate 36, the carrier 56, and the solder 58. Accordingly, choosing materials for each of these with similar CTEs may decrease the mechanical stress in the connection 52. In one embodiment, the substrate 36 is chosen from a group of materials including aluminum oxide ($Al_2O_3$), zinc oxide (ZnO), aluminum nitride (AlN), FR4, and Polyimide, the electrical contacts 38 may be chosen from a group of materials including gold, nickel-gold, nickel-silver, nickel-palladium-gold, and copper, the carrier 56 is chosen from a group of materials including Invar and Kovar, and the solder 58 is chosen from a group of materials including SAC305 (96.5% tin, 3% silver, and 0.5% copper), SAC 405 (95.5% tin, 4% silver, and 0.5% copper) and SAC387 (95.5% tin, 3.8% silver, and 0.7% copper). In various embodiments, the materials chosen for the substrate 36, the electrical contacts 38, the carrier 56, and the solder 58 are chosen such that the CTE mismatch is optimized towards a minimal level (e.g., between each is less than about 0.1 to 1%). Those of ordinary skill in the art will recognize additional materials that may be used for each one of the substrate 36, the carrier 56, and the solder 58 that may reduce the CTE mismatch between each.

Aside from selecting materials that eliminate or minimize CTE mismatches, one can also make the interconnecting material (solder—as called out above, or copper pillars) thicker to absorb the strains generated by the CTE mismatch stresses. Interconnect columns can be generated by electroplating, or otherwise depositing tall thin structures through pick and place or physical vapor deposition (PVD) techniques known in the art. Thicknesses needed are related to the magnitude of the CTE mismatch and can be 2×, 5×, 10× or 25× that of conventional solder attach material thicknesses.

Those skilled in the art will recognize improvements and modifications to the preferred embodiments of the present disclosure. All such improvements and modifications are considered within the scope of the concepts disclosed herein and the claims that follow.

What is claimed is:

1. A surface mount device (SMD) comprising:
   a substrate; and
   one or more electrical contacts on a first surface of the substrate, each of the one or more electrical contacts configured to be electrically coupled to a corresponding electrical contact on a surface of a carrier and located within a lateral distance from a center point of the substrate that is less than about 50% of a total width of the first surface.

2. The SMD of claim 1 wherein the lateral distance is less than about 25% of the total width of the first surface.

3. The SMD of claim 1 further comprising a solder mask separating the one or more electrical contacts.

4. The SMD of claim 1 further comprising a thermal pad on the first surface of the substrate and separated from the one or more electrical contacts, the thermal pad configured to be thermally coupled to an electrically inactive portion of the carrier.

5. The SMD of claim 4 wherein the thermal pad is separated into a plurality of sections.

6. The SMD of claim 3 wherein at least one of the one or more electrical contacts is separated into a plurality of sections.

7. The SMD of claim 6 further comprising a thermal pad separated from the one or more electrical contacts, the thermal pad configured to be thermally coupled to an electrically inactive portion of the carrier.

8. The SMD of claim 7 wherein the thermal pad is separated into a plurality of sections.

9. The SMD of claim 1 further comprising one or more light emitting diodes (LEDs) on a second surface of the substrate opposite the first surface and electrically coupled to the one or more electrical contacts by one or more vias running through the surface of the substrate.

10. A surface mount device (SMD) comprising:
    a substrate; and
    one or more electrical contacts on a first surface of the substrate, each of the one or more electrical contacts configured to be electrically coupled to a corresponding electrical contact on a surface of a carrier and located within a concentric area of the first surface that is less than about 50% of an overall area of the first surface.

11. The SMD of claim 10 wherein the concentric area is less than about 25% of the overall area of the first surface.

12. The SMD of claim 10 further comprising a solder mask separating the one or more electrical contacts.

13. The SMD of claim 12 further comprising a thermal pad separated from the one or more electrical contacts, the thermal pad configured to be thermally coupled to an electrically inactive portion of the carrier.

14. The SMD of claim 13 wherein the thermal pad is separated into a plurality of sections.

15. The SMD of claim 10 wherein at least one of the one or more electrical contacts is separated into a plurality of sections.

16. The SMD of claim 15 further comprising a thermal pad separated from the one or more electrical contacts, the thermal pad configured to be thermally coupled to an electrically inactive portion of the carrier.

17. The SMD of claim 16 wherein the thermal pad is separated into a plurality of sections.

18. The SMD of claim 10 wherein each of the one or more electrical contacts has a circular perimeter.

19. The SMD of claim 18 further comprising a thermal pad separated from the one or more electrical contacts, the thermal pad configured to be thermally coupled to an electrically inactive portion of the carrier.

20. The SMD of claim 19 wherein the thermal pad is separated into a plurality of sections such that a first section of the thermal pad surrounds the electrical contacts and a second section of the thermal pad surrounds the first section.

21. The SMD of claim 10 further comprising one or more light emitting diodes (LEDs) on a second surface of the substrate opposite the first surface and electrically coupled to the electrical contacts by one or more vias running through the surface of the substrate.

22. A surface mount device (SMD) comprising:
  a substrate; and
  one or more electrical contacts on the first surface of the substrate, each of the one or more electrical contacts configured to be electrically coupled to a corresponding electrical contact on a surface of a carrier, wherein at least one of the one or more electrical contacts is separated into a plurality of sections.

23. The SMD of claim 22 further comprising a thermal pad separated from the one or more electrical contacts, the thermal pad configured to be thermally coupled to an electrically inactive portion of the carrier.

24. The SMD of claim 23 wherein the thermal pad is separated into a plurality of sections.

25. The SMD of claim 22 further comprising one or more light emitting diodes (LEDs) on a second surface of the substrate opposite the first surface and electrically coupled to the electrical contacts by one or more vias running through the surface of the substrate.

* * * * *